United States Patent
Chun et al.

(10) Patent No.: US 7,061,804 B2
(45) Date of Patent: Jun. 13, 2006

(54) ROBUST AND HIGH-SPEED MEMORY ACCESS WITH ADAPTIVE INTERFACE TIMING

(75) Inventors: Dexter Tamio Chun, San Diego, CA (US); Ajit Patil, San Diego, CA (US); Ian Huang, San Diego, CA (US); Jason Chan, San Diego, CA (US); Timothy Gold, Ramona, CA (US)

(73) Assignee: QUALCOMM Incorporated, San Diego, CA (US)

( * ) Notice: Subject to any disclaimer, the term of this patent is extended or adjusted under 35 U.S.C. 154(b) by 63 days.

(21) Appl. No.: 10/993,034

(22) Filed: Nov. 18, 2004

(65) Prior Publication Data
US 2006/0104115 A1    May 18, 2006

(51) Int. Cl.
*G11C 11/34* (2006.01)
(52) U.S. Cl. ................ 365/185.17; 365/238.5
(58) Field of Classification Search ........... 365/185.17, 365/238.5
See application file for complete search history.

(56) References Cited

U.S. PATENT DOCUMENTS

| | | | | |
|---|---|---|---|---|
| 5,210,870 A | * | 5/1993 | Baum et al. ............... | 707/7 |
| 6,657,892 B1 | * | 12/2003 | Sakui et al. ............ | 365/185.14 |
| 2003/0126392 A1 | * | 7/2003 | Miura et al. ............... | 711/167 |

* cited by examiner

*Primary Examiner*—Michael Tran
(74) *Attorney, Agent, or Firm*—Philip Wadsworth; Charles D. Brown; Howard H Seo

(57) ABSTRACT

Techniques for quickly and reliably accessing a memory device (e.g., a NAND Flash memory) with adaptive interface timing are described. For memory access with adaptive interface timing, the NAND Flash memory is accessed at an initial memory access rate, which may be the rate predicted to achieve reliable memory access. Error correction coding (ECC), which is often employed for NAND Flash memory, is then used to ensure reliable access of the NAND Flash. For a read operation, one page of data is read at a time from the NAND Flash memory, and the ECC determines whether the page read from the NAND Flash memory contains any errors. If errors are encountered, then a slower memory access rate is selected, and the page with error is read again from the NAND Flash memory at the new rate. The techniques may be used to write data to the NAND Flash memory.

33 Claims, 8 Drawing Sheets

ROBUST AND HIGH-SPEED MEMORY ACCESS WITH ADAPTIVE INTERFACE TIMING

BACKGROUND

I. Field

The present invention relates generally to electronics circuits, and more specifically to techniques for accessing a memory device.

II. Background

Wireless communication devices (e.g., cellular phones) are capable of providing various communication services such as voice and packet data. Newer generation wireless devices may also be capable of providing enhanced functionality and may be used as a personal digital assistant (PDA), a Web terminal, a computing device, and so on. As wireless devices become more complex and provide more functions and features, more computing power and larger memories are inevitably required. A large memory is typically needed to store program code and data used to support voice and/or data communication as well as other functions and features.

Various types of memory may be used for wireless devices, such as static random access memory (SRAM), synchronous dynamic RAM (SDRAM), and Flash. SRAM and SDRAM are volatile memories that lose the data stored therein once power is removed. SRAM and SDRAM can be accessed in a random manner, which is the manner most processors access memories for program code and data. SRAM and/or SDRAM are thus commonly used as the main run-time memory in wireless devices.

Flash is a non-volatile memory that can retain the data stored therein even after power is removed. NAND Flash, which is one type of Flash, is a high-density memory design and has certain advantages over other types of memory. In particular, NAND Flash has large storage capacity (e.g., one giga bits or more), good speed for continued memory access, and low cost. However, NAND Flash also has certain inherent drawbacks such as poor performance for random memory access. Consequently, NAND Flash is typically accessed in units of pages, one page at a time, with each page being of a particular size (e.g., 512 bytes).

As the cost of memories in wireless devices becomes more prohibitive, NAND Flash is a good candidate for use as the mass storage unit for these devices. However, because the structure of NAND Flash is not suitable for random access, program code cannot be executed directly from the NAND Flash. Instead, SRAM and/or SDRAM may be used to provide run-time storage for program code and data that need to be accessed in a random manner.

A memory architecture that incorporates both NAND Flash and SRAM/SDRAM is able to provide large storage capacity with random access at reduced cost. For a device having such a memory architecture, the program code may be loaded into the NAND Flash for permanent storage. Upon being powered on, the device performs a "boot", which entails (among other things) transferring the program code from the NAND Flash to the SRAM/SDRAM. Since the program code may be large in size (e.g., several mega bits), the boot time may be quite long (e.g., on the order of seconds). Slow boot time can lead to user dissatisfaction and is especially undesirable for devices that may be powered off and on frequently, such as cellular phones.

There is therefore a need in the art for techniques to quickly access NAND Flash for data transfers.

SUMMARY

Techniques for quickly and reliably accessing a memory device, such as a NAND Flash memory, with adaptive interface timing are described herein. The NAND Flash memory can often be reliably accessed at a higher rate than the slow memory access rate needed for the worst-case condition, which is often not encountered. The memory access rate is defined by, and is inversely related to, the time duration used for each NAND Flash memory access. For memory access with adaptive interface timing, the NAND Flash memory is first accessed at an initial memory access rate, which may be a memory access rate that is predicted to achieve fast and reliable memory access. Error correction coding (ECC), which is often employed for NAND Flash memory, is then used to ensure reliable access of the NAND Flash memory. For a read operation, one page of data is read at a time from the NAND Flash memory, and the ECC determines whether the page read from the NAND Flash memory contains any errors. If errors are encountered, then a slower memory access rate is selected, and the page with error is read again from the NAND Flash memory at this slower memory access rate. The techniques may also be used to write data to the NAND Flash memory.

In an embodiment, a NAND Flash controller includes a control unit and a detection unit. To read from a NAND Flash memory, the control unit obtains a first (or initial) setting for a first memory access rate. The control unit generates, in accordance with the first setting, various control signals to read a first page of data from the NAND Flash memory at the first memory access rate. The detection unit determines whether the first page of read data contains any errors. If the first page contains errors, then the control unit obtains a second setting for a second memory access rate that is slower than the first memory access rate. The process of reading a page, checking the page for errors, and selecting a slower memory access rate continues until the page is successfully read from the NAND Flash memory. Each subsequent page is then read from the NAND Flash memory in the same manner, e.g., starting with the memory access rate that resulted in a successful read of the prior page. The NAND Flash controller may also write to the NAND Flash memory with adaptive interface timing, as described below.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The memory access techniques described herein may be used for various electronic devices, such as those used for wireless communication, personal electronics, computing, networking, and so on. For clarity, these techniques are described for a wireless communication device used for communication with one or more wireless communication systems, such as a Code Division Multiple Access (CDMA) system, a Global System for Mobile Communications (GSM) system, and/or some other systems. A CDMA system may implement cdma2000, Wideband-CDMA (W-CDMA), or some other CDMA radio access technologies (RATs). W-CDMA and GSM are part of Universal Mobile Telecommunications System (UMTS), which is described in documents from a consortium named "3rd Generation Partnership Project" (3GPP). cdma2000 is described in documents from a consortium named "3rd Generation Partnership Project 2" (3GPP2). 3GPP and 3GPP2 documents are publicly available.

Figure 1:
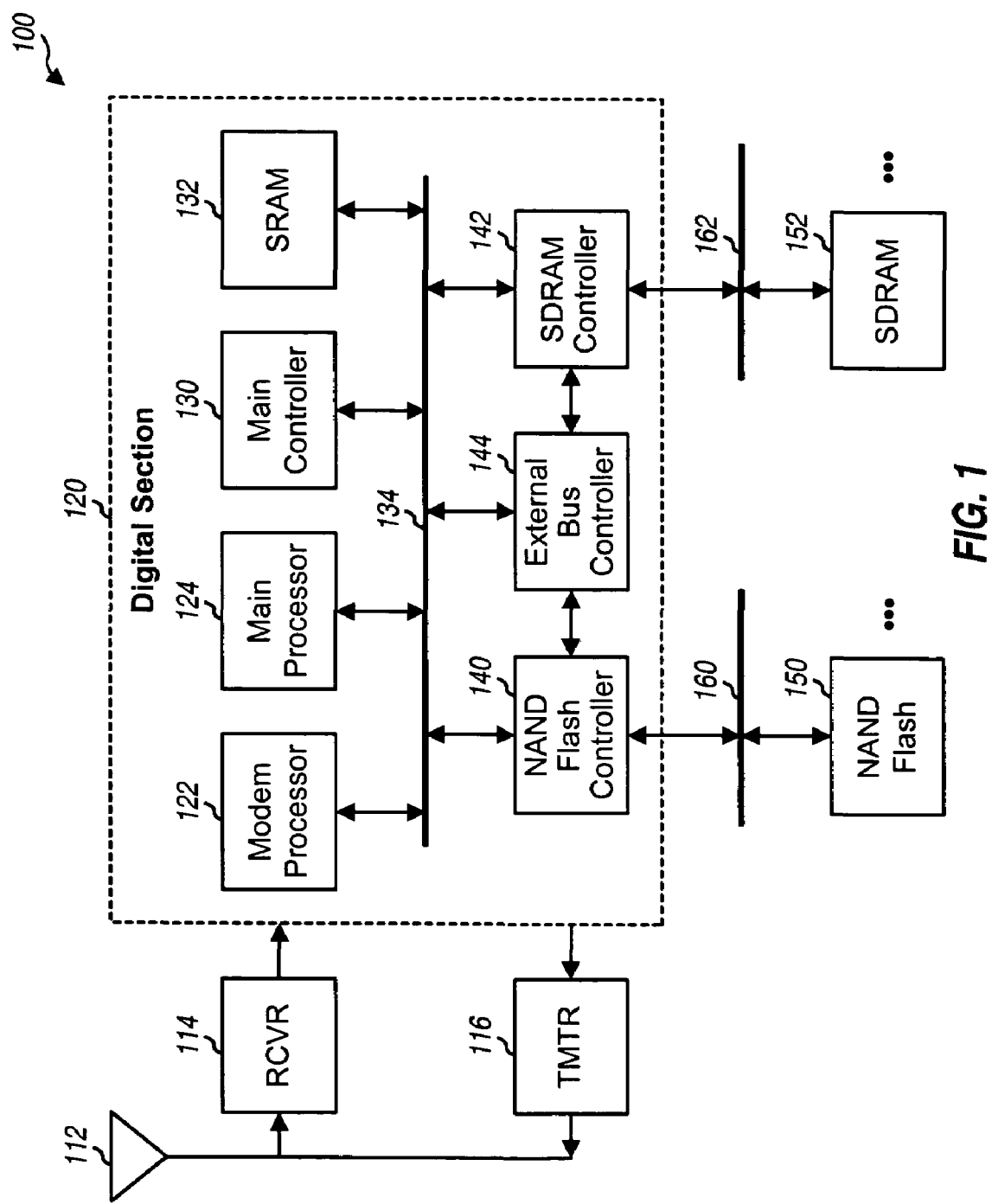
FIG. 1 shows a block diagram of a wireless communication device.

FIG. 1 shows a block diagram of a wireless communication device 100, which may support cdma2000, GSM, W-CDMA, and/or other wireless systems/networks. Wireless device 100 may be a cellular phone, a handset, a handheld device, a wireless module, a PDA, a terminal, a modem, or some other apparatus. Wireless device 100 is capable of providing bi-directional communication via a receive path and a transmit path. For the receive path, signals transmitted by base stations are received by an antenna 112 and provided to a receiver unit (RCVR) 114. Receiver unit 114 conditions and digitizes the received signal and provides input samples to a digital section 120 for further processing. For the transmit path, a transmitter unit (TMTR) 116 receives and conditions data to be transmitted by wireless device 100 and generates a modulated signal, which is transmitted via antenna 112 to the base stations.

Digital section 120 includes various processing, interface, and memory units that perform digital processing for wireless device 100. For the embodiment shown in FIG. 1, digital section 120 includes a modem processor 122, a main processor 124, a main controller 130, an SRAM 132, a NAND Flash controller 140, an SDRAM controller 142, and an external bus controller 144. Modem processor 122 performs processing for data transmission and reception (e.g., encoding, modulation, demodulation, decoding, and so on). Main processor 124 may perform processing for audio, video, graphics, and/or other applications such as, for example, multi-way calls, web browsing, media player, games, user interface, and so on. Digital section 120 may include multiple processors for different functions.

NAND Flash controller 140 facilitates transfer of data between digital section 120 and a NAND Flash 150. SDRAM controller 142 facilitates transfer of data between digital section 120 and an SDRAM 152. External bus controller 144 may direct the operation of NAND Flash controller 140 and SDRAM controller 142 and may facilitate data transfer between NAND Flash 150 and SDRAM 152. External bus controller 144 may further direct and/or interface with other units and devices that are external to digital section 120 such as, for example, a liquid crystal display (LCD), a serial bus, an input device (e.g., keypads), and so on.

Main controller 130 may direct the operation of various processing and interface units within digital section 120. SRAM 132 stores program code and data used by the controllers and processors within digital section 120. The various units within digital section 120 may communicate via one or more buses 134.

The controllers and processors within digital section 120 may be implemented with one or more digital signal processors (DSPs), micro-processors, reduced instruction set computing (RISC) processors, complex instruction set computing (CISC) processors, and so on. The units within digital section 120 may be fabricated on one or more application specific integrated circuits (ASICs) or some other types of integrated circuit (IC).

NAND Flash 150 and SDRAM 152 are memory devices that are external to digital section 120 and provide mass storage for the processing units within digital section 120. NAND Flash 150 provides non-volatile storage for program code and data used by digital section 120. NAND Flash 150 may also be replaced with some other types of non-volatile memory. SDRAM 152 provides storage with random access capability for program code and data used by digital section 120. SDRAM memory 152 may also be replaced with some other types of volatile memory (e.g., SRAM, DRAM, and so on) and/or non-volatile memory (e.g., NOR Flash).

For the embodiment shown in FIG. 1, NAND Flash controller 140 and NAND Flash 150 communicate via a bus 160, and SDRAM controller 142 and SDRAM 152 communicate via a bus 162. Although not shown in FIG. 1 for simplicity, other devices may also be coupled to bus 160 and/or bus 162. Bus 162 may be designated as a fast bus and designed for high speed of operation. This may be achieved by attaching few (and typically only fast) external devices to bus 162 and minimizing parasitic capacitance on bus 162. Bus 160 may be designated as a slow bus and used to support slower devices. For example, an LCD, an SRAM, an input device, and so on (not shown in FIG. 1) may communicate with digital section 120 via bus 160. The parasitic capacitance on bus 160 may thus be much higher than the parasitic capacitance on bus 162.

To ensure a reliable boot upon power on of wireless device 100, data may be retrieved from NAND Flash 150 at the fastest possible memory access rate that is guaranteed to meet all of the timing requirements for the NAND Flash under the worst-case condition. This worst-case condition corresponds to the worst possible variations in IC process, temperature, voltage, bus loading, and so on. The memory access rate for the worst-case condition is called the worst-case access rate. Because the worst-case condition may be severe, the worst-case access rate for the NAND Flash may be quite slow. If many pages of data are retrieved at the worst-case access rate, then the boot time may be quite slow, which would be highly undesirable.

Adaptive interface timing may be used to achieve fast and reliable access of the NAND Flash. The worst-case condition is not encountered most of the time, and the NAND Flash can often be reliably accessed at a higher rate than the worst-case access rate. Error correction coding (ECC) is typically used for the NAND Flash to provide data integrity and to ensure reliable access of the NAND Flash. For a power-on boot, the NAND Flash may be accessed at an initial memory access rate, which may be a rate predicted to achieve reliable memory access. This initial memory access rate is typically faster (and may be much faster) than the worst-case access rate. The ECC capability of the NAND Flash is then used to determine whether the initial memory access rate for the NAND Flash is good or whether a slower memory access rate should be selected.

Figure 2:
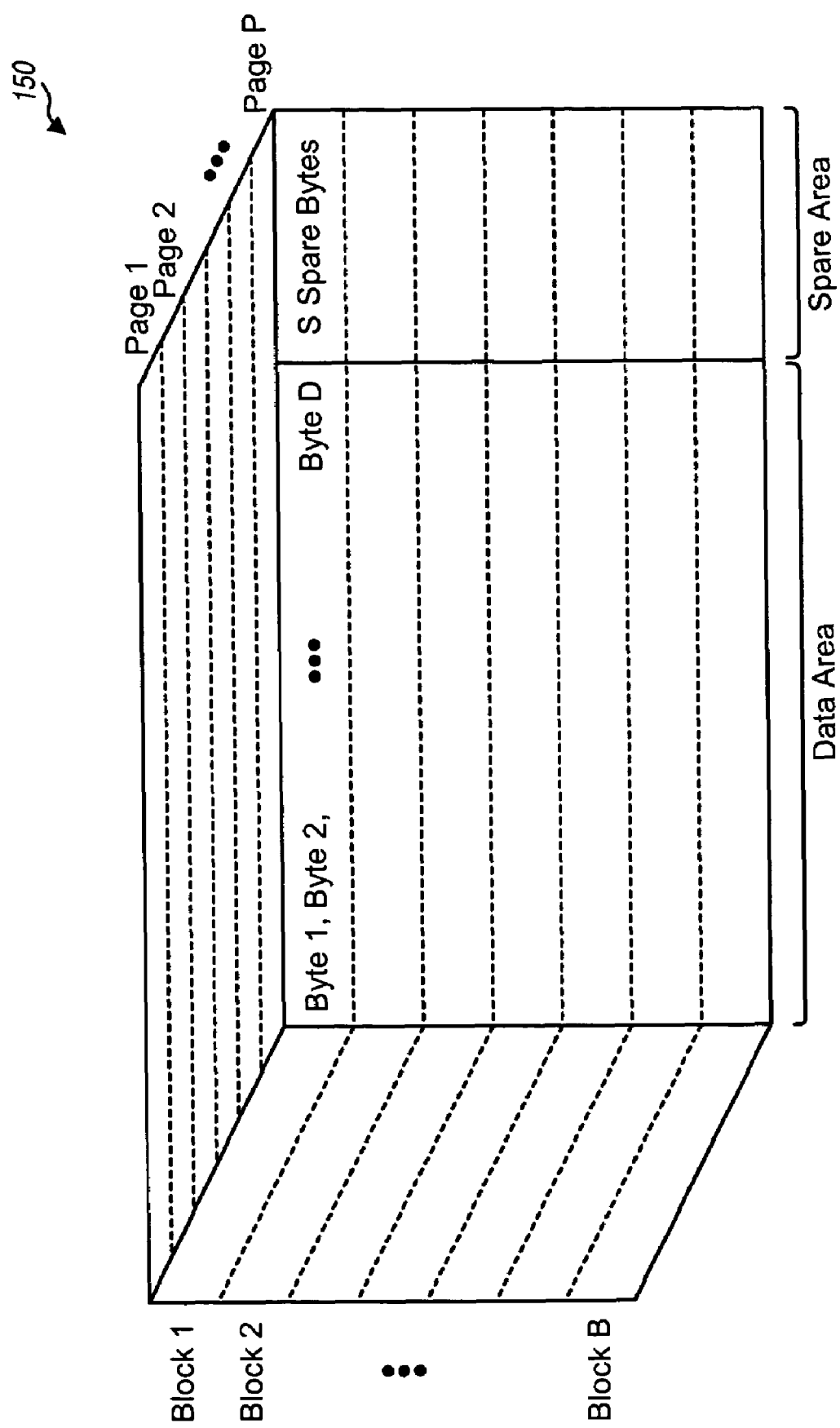
FIG. 2 shows an exemplary structure of a NAND Flash.

FIG. 2 shows an exemplary structure of NAND Flash 150. The NAND Flash is partitioned into B equal-size blocks, and each block has P equal-size pages. Each page includes a data area composed of D bytes and a spare area composed of S bytes. In general, B, P, D and S may be any values. As a specific example, a NAND Flash may have B=4096 blocks, with each block containing P=32 pages and each page including D=512 data bytes and S=16 spare bytes. This NAND Flash would then have a storage capacity of 512 Mbits or 64 Mbytes. Certain NAND Flash operations (e.g., read and write) are typically performed on units of pages while other NAND Flash operations (e.g., erase) are typically performed on units of blocks. Various NAND Flash memory devices are commercially available. The memory access techniques described herein may be used with NAND Flash of any size and structure.

NAND Flash as well as other memory devices are susceptible to errors during read and write operations due to various factors such as, e.g., non-compliant interface timing. Furthermore, NAND Flash is increasingly susceptible to bit errors over its operating lifetime. To verify the integrity of the data stored in/read from the NAND Flash, error detection coding or error correction coding may be used for each page of data in the NAND Flash. Error detection coding is able to detect but not correct errors in a page. Error correction coding is able to detect errors in a page and to correct up to a predetermined number of bit errors in the page. Each page is associated with a spare area, as shown in FIG. 2, and the spare area may be used to store error detection/correction information for the page. The memory access techniques described herein may be used in conjunction with error detection coding or error correction coding. For clarity, these techniques are specifically described below in conjunction with error correction coding.

Figure 3:
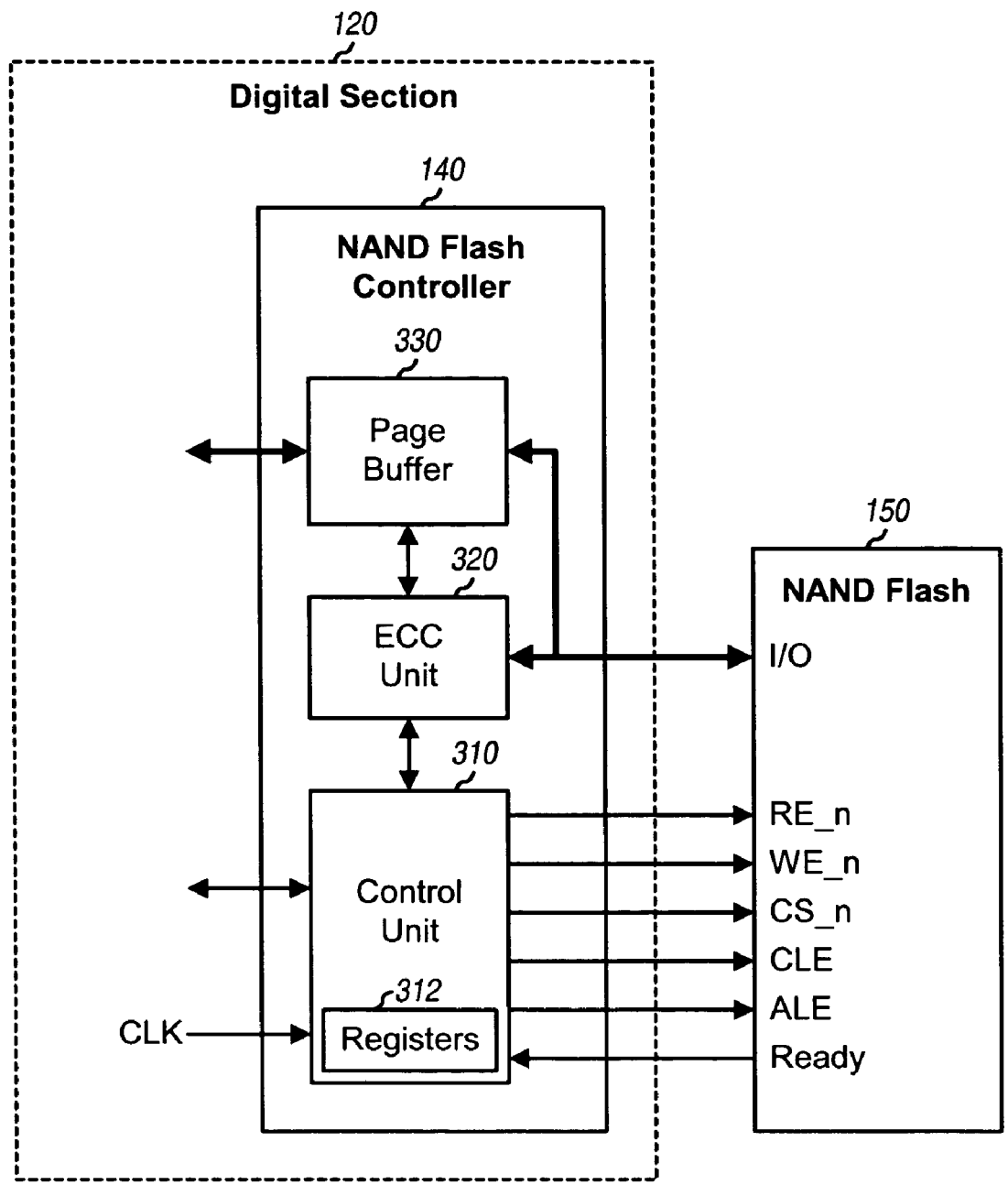
FIG. 3 shows a block diagram of a NAND Flash controller.

FIG. 3 shows a block diagram of an embodiment of NAND Flash controller 140 with ECC capability. NAND Flash controller 140 includes a control unit 310, an ECC unit 320, and a page buffer 330, all of which can operate to read or write one page of data at a time to/from NAND Flash 150. Registers 312 within control unit 310 store pertinent parameters (e.g., the current setting) for the control unit.

For a read operation, control unit 310 is first loaded with the address of a specific page to be read from NAND Flash 150 and is then provided with a command to start reading the page. The page address and command may come from main controller 130 or main processor 124. Control unit 310 then provides a Read command and the address of the selected page to the NAND Flash. Control unit 310 thereafter generates and provides the proper control signals to read one byte of data at a time from the NAND Flash for the selected page. Each data byte read from the NAND Flash is stored in page buffer 330. ECC unit 320 also receives each data byte as it is read in and uses the data byte to generate an ECC value for the selected page. After all data bytes in the selected page have been read from the NAND Flash, the ECC value stored in the spare area for the selected page is read. ECC unit 320 then compares the stored ECC value against the generated ECC value for the selected page. Based on the result of the comparison, ECC unit 320 is able to determine whether there are any errors in the page just read from the NAND Flash. ECC unit 320 may also use the stored ECC value to determine the location of each bit error and to correct each bit error, up to the maximum number of bit errors. For each page, the maximum number of bit errors that may be corrected based on the ECC value is determined by the error correction capability of the ECC scheme selected for use. ECC unit 320 may inform control unit 310 of detected, corrected, and/or uncorrectable errors. Uncorrectable errors are errors that exceed the error correction capability of the ECC scheme used for the NAND Flash.

For a write operation, control unit 310 is first loaded with the address of a specific page in the NAND Flash where a page of data is to be written and is then provided with a command to start writing the page. Control unit 310 then provides a Write command and the address of the selected page to the NAND Flash. Control unit 310 thereafter generates and provides the proper control signals to write one byte of data at a time from page buffer 330 to the NAND Flash. ECC unit 320 also receives each data byte written to the NAND Flash and uses the data byte to generate an ECC value for the page. After all data bytes in the page have been written to the NAND Flash, the ECC value generated by ECC unit 320 is written to the spare area for the page. Each page of data in the NAND Flash is thus associated with an ECC value that may be used, during a subsequent read, to detect and correct for bit errors in the page.

Table 1 lists the control signals exchanged between control unit 310 and NAND Flash 150.

TABLE 1

| Signal Name | | Description |
| --- | --- | --- |
| CS_n | chip select | Enables operation of the NAND Flash. |
| CLE | command latch enable | Controls loading of commands into an internal command register within the NAND Flash. |
| ALE | address latch enable | Controls loading of either address information or input data into an internal address/data register within the NAND Flash. |
| WE_n | write enable | Controls writing of data to an I/O port of the NAND Flash. |
| RE_n | read enable | Controls reading of data from the I/O port of the NAND Flash. |
| Ready | ready | Indicates whether the NAND Flash is busy or ready. |

The "_n" for the CS_n, RE_n, and WE_n signals indicates that these signals are active with logic low. When the NAND Flash is busy, as indicated by the Ready signal being at logic low, control unit 310 does not provide any control signals to the NAND Flash. Detailed description of the control signals listed in Table 1 may be obtained from data sheets for commercially available NAND Flash memory devices.

Figure 4:
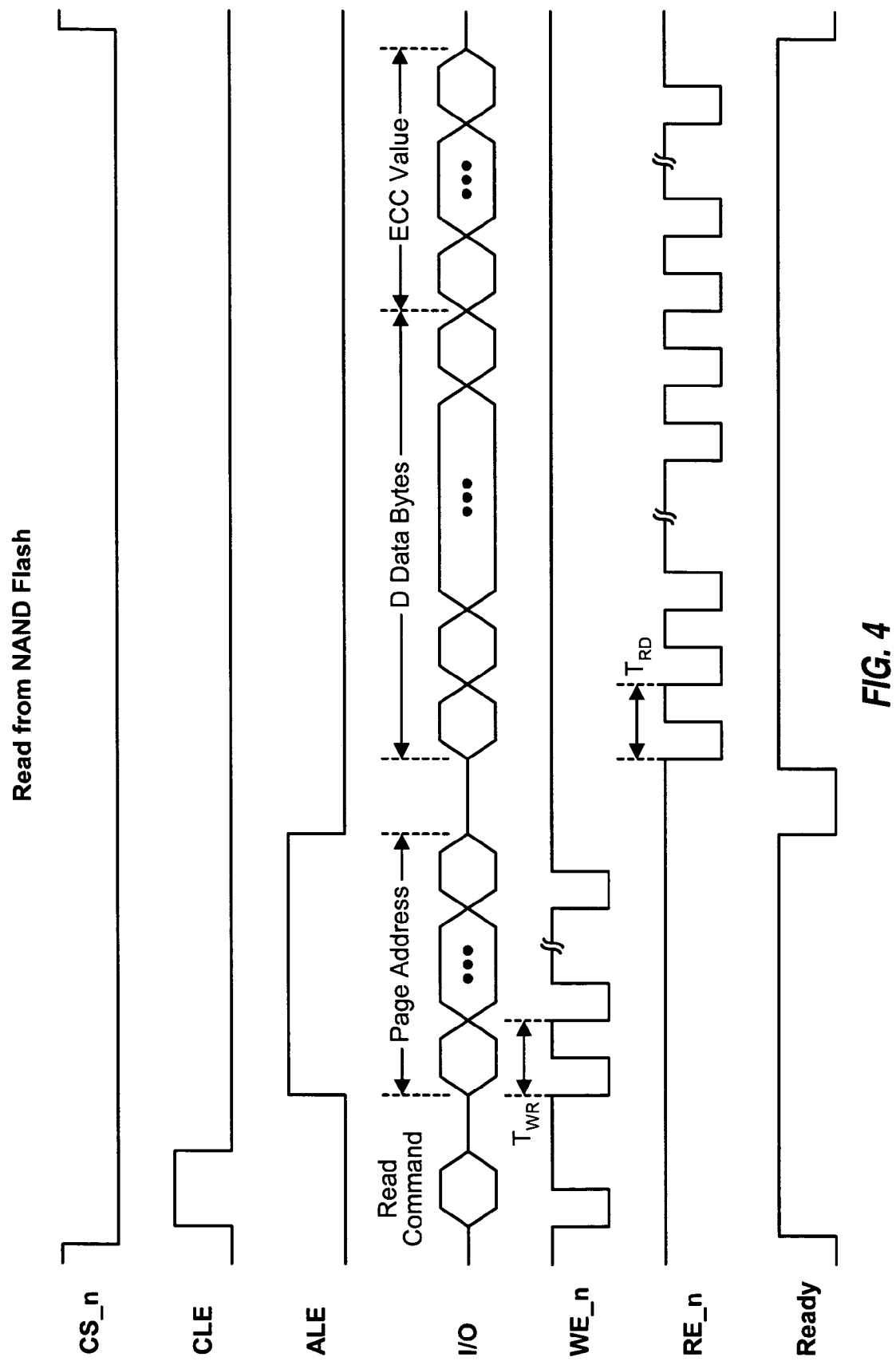
FIG. 4 shows a timing diagram for reading data from the NAND Flash.

FIG. 4 shows a timing diagram for reading a page of data from the NAND Flash. To read the selected page, the NAND Flash is first activated by bringing the CS_n signal to logic low. A Read command is then sent to the NAND Flash by bringing the CLE signal to logic high and providing the Read command to the I/O port of the NAND Flash. The page address is next sent to the NAND Flash by bringing the ALE signal to logic high and providing the page address to the I/O port. The page address is provided one byte at a time, with the number of address bytes being determined by the size and structure of the NAND Flash.

The actual read of the selected page can commence when the Ready signal is brought to logic high, which indicates that the NAND Flash is not busy. Each byte of data for the selected page is read from the NAND Flash by providing the proper RE_n signal to the NAND Flash. After all data bytes for the selected page have been read from the NAND Flash, the ECC value stored in the spare area for the selected page is read from the NAND Flash. After the entire ECC value has been read, the NAND Flash is disabled by bringing the CS_n signal to logic high.

Figure 5:
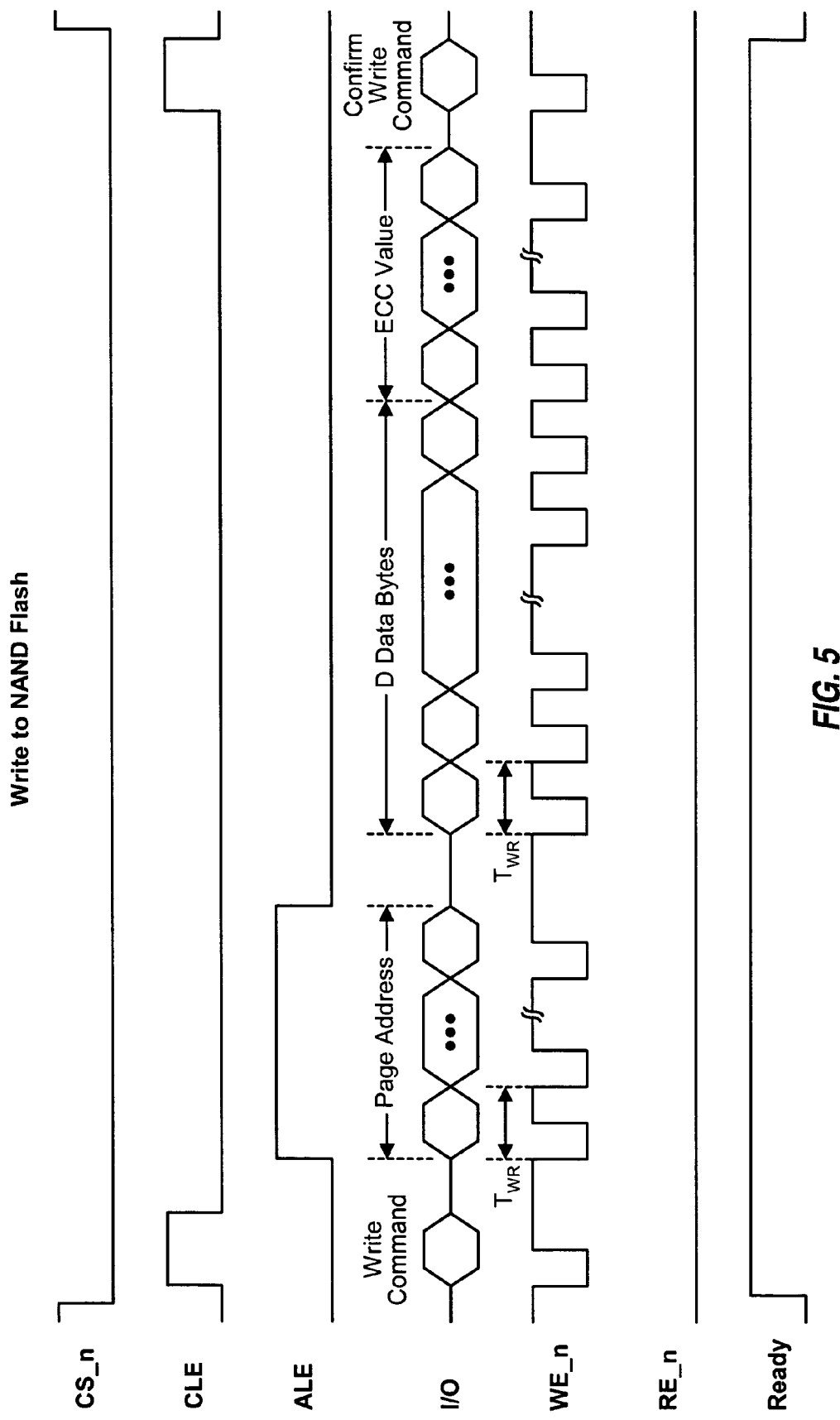
FIG. 5 shows a timing diagram for writing data to the NAND Flash.

FIG. 5 shows a timing diagram for writing a page of data to the NAND Flash. To write the selected page, the NAND Flash is first activated by bringing the CS_n signal to logic low. The NAND Flash indicates that it is not busy by bringing the Ready signal to logic high. A Write command is then sent to the NAND Flash, and the page address is thereafter sent to the NAND Flash via the I/O port.

Each byte of data for the selected page is then written to the NAND Flash by providing the proper WE_n signal to the NAND Flash. The data byte is also received by ECC unit 320 and used to generate an ECC value for the page. After all data bytes for the selected page have been written to the NAND Flash, the ECC value generated for the page is written to the spare area for the selected page. After the entire ECC value has been written, a Confirm Write command is sent to the NAND Flash and the NAND Flash is thereafter disabled by bringing the CS_n signal to logic high.

Referring back to FIG. 3, control unit 310 receives an input clock (CLK) and generates the RE_n, WE_n, and other control signals for the NAND Flash based on this input clock. Control unit 310 may use any number of input clock cycles for each NAND Flash access. A NAND Flash access is a read or a write of one data byte from/to the NAND Flash. The number of input clock cycles for each memory access determines the memory access rate, i.e., the memory access rate is inversely related to the number of input clock cycles per memory access. The NAND Flash access rate is selected to achieve reliable access of the NAND Flash and may be dynamically adjusted based on access performance, as described below. Control unit 310 generates the proper RE_n signal for reading data from the NAND Flash and the proper WE_n signal for writing data to the NAND Flash, both based on the selected NAND Flash access rate.

Figure 6A:
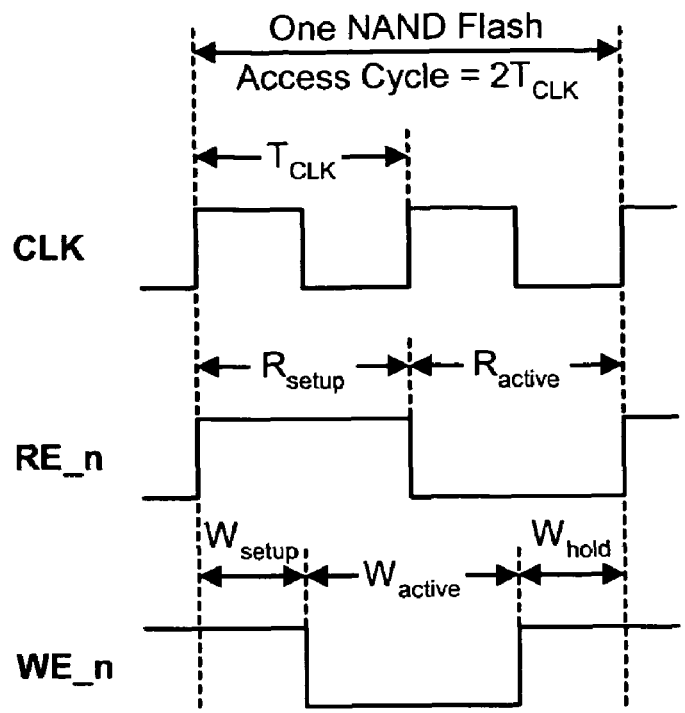
FIGS. 6A and 6B show the generation of read enable (RE_n) and write enable (WE_n) signals for memory access rates with two and four input clock cycles, respectively, per memory access.

FIG. 6A shows a timing diagram of an embodiment for generating the RE_n and WE_n signals for a NAND Flash access rate with two input clock cycles (or $2T_{CLK}$) per NAND Flash access. For each memory access to read one data byte from the NAND Flash, the RE_n signal has a logic high setup portion (labeled as $R_{setup}$) followed by a logic low active portion (labeled as $R_{active}$). For the embodiment in FIG. 6A, the read setup portion is one clock cycle wide, and the read active portion is also one clock cycle wide. For each memory access to write one data byte to the NAND Flash, the WE_n signal has a logic high setup portion (labeled as $W_{setup}$) followed by a logic low active portion (labeled as $W_{active}$), and further followed by a logic high hold portion (labeled as $W_{hold}$). For the embodiment in FIG. 6A, the write setup portion is half a clock cycle wide, the write active portion is one clock cycle wide, and the write hold portion is also half a clock cycle wide.

Figure 6B:
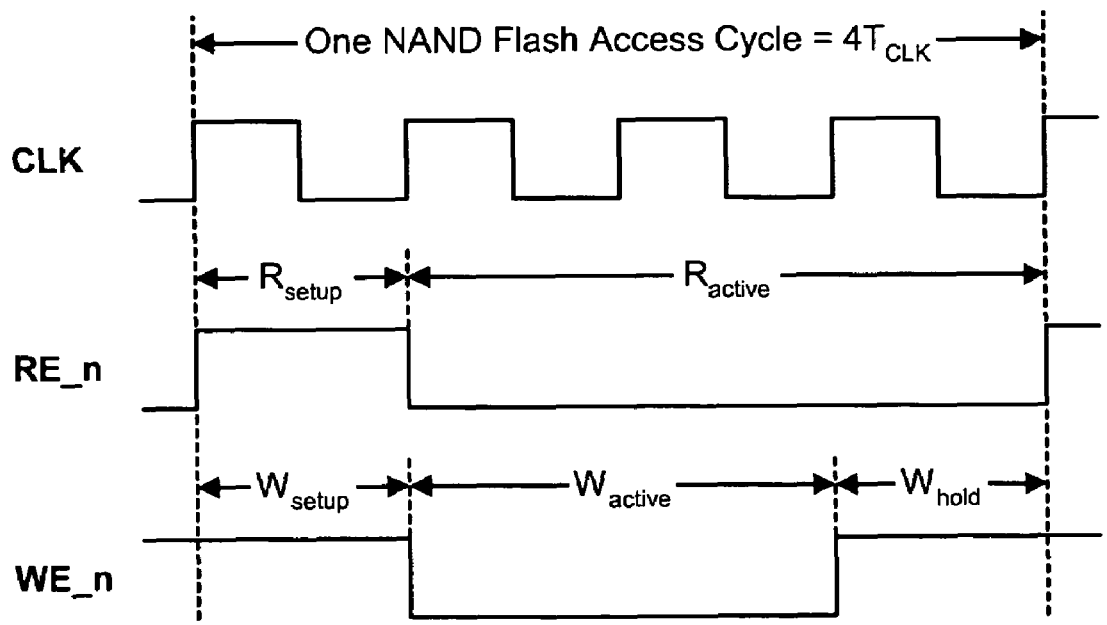

FIG. 6B shows a timing diagram of an embodiment for generating the RE_n and WE_n signals for a NAND Flash access rate with four input clock cycles (or $4T_{CLK}$) per NAND Flash memory access. For the RE_n signal, the read setup portion is one clock cycle wide, and the read active portion is three clock cycles wide. For the WE_n signal, the write setup portion is one clock cycle wide, the write active portion is two clock cycles wide, and the write hold portion is also one clock cycle wide.

Table 2 shows an embodiment for generating the RE_n and WE_n signals with different numbers of input clock cycles for different NAND Flash access settings (or simply, "settings"). A setting may also be referred to as a wait state, a mode, a configuration, or some other terminology. Each setting is associated with a different NAND Flash access rate, which is given in an integer number of input clock cycles in column 2 of Table 2. For each setting, the setup portion $R_{setup}$ and the active portion $R_{active}$ for the RE_n signal are given in the third and fourth columns, respectively, of Table 2. The setup portion $W_{setup}$, the active portion $W_{active}$, and the hold portion $W_{hold}$ for the WE_n signal are given in the fifth, sixth, and seventh columns, respectively, of Table 2.

TABLE 2

| Setting | Number Clock Cycles | NAND Flash Read | | NAND Flash Write | | |
|---|---|---|---|---|---|---|
| | | $R_{setup}$ | $R_{active}$ | $W_{setup}$ | $W_{active}$ | $W_{hold}$ |
| 0 | 2 | 1 | 1 | 0.5 | 1 | 0.5 |
| 1 | 3 | 1 | 2 | 0.5 | 2 | 0.5 |
| 2 | 4 | 1 | 3 | 1 | 2 | 1 |
| 3 | 5 | 1 | 4 | 1 | 3 | 1 |
| 4 | 6 | 2 | 4 | 1 | 3 | 2 |
| 5 | 9 | 4 | 5 | 1 | 5 | 3 |
| 6 | 17 | 9 | 8 | 1 | 8 | 8 |
| 7 | 32 | 17 | 15 | 1 | 16 | 15 |

Table 2 shows a specific embodiment with eight settings and specific embodiments of the RE_n and WE_n signals for read and write operations, respectively. In general, any number of settings may be supported, each setting may be associated with any (integer or non-integer) number of input clock cycles, and the various portions of the RE_n and WE_n signals may be defined to have any suitable time durations. The number of settings and the definition for each setting may be dependent on various factors such as, for example, the timing requirements of the NAND Flash memory device, the frequency of the input clock, the capacitance loading on the bus between the NAND Flash controller and the NAND Flash, and so on. A NAND Flash typically requires the RE_n signal to be at logic low for a longer time, and $R_{active}$ is often slightly longer than $R_{setup}$. However, both $R_{active}$ and $R_{setup}$ increase in duration when there is excessive capacitive load on the bus, or under conditions when pad/line drivers may be weakened.

Figure 7:
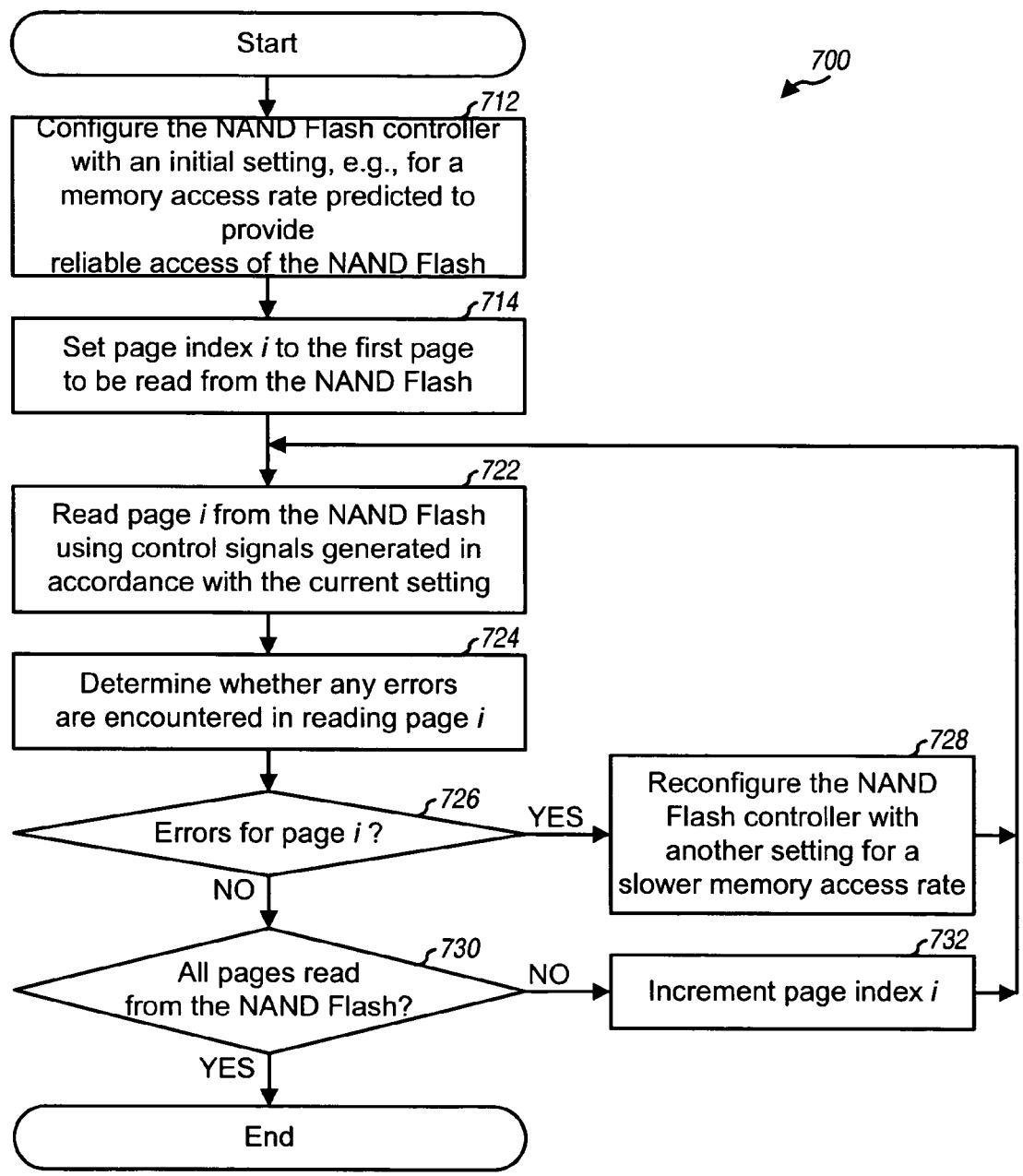
FIG. 7 shows a process for reading data from the NAND Flash with adaptive interface timing.

FIG. 7 shows a flow diagram of a process 700 for reading data from the NAND Flash with adaptive interface timing. Process 700 may be used to transfer program code from the NAND Flash to the SDRAM as part of a boot whenever the wireless device is powered on. Initially, NAND Flash controller 140 is configured with an initial setting, which may be for the NAND Flash access rate predicted to provide reliable access of the NAND Flash (block 712). This initial setting may be determined based on the design of the wireless device and may further be selected to achieve successful read of the NAND Flash under the majority of operating conditions. This initial setting may also be the setting that was used most recently to successfully read from the NAND Flash. The initial setting may also be the setting for the fastest memory access rate supported by the wireless device (e.g., setting 0 in Table 2). In any case, control unit 310 generates the RE_n, WE_n, and other control signals for the NAND Flash in accordance with the initial setting.

A page index i is set to the first page to be read from the NAND Flash (block 714). Page i is then read from the NAND Flash using the control signals generated in accordance with the current setting which, for the first page, is the initial setting (block 722). In an embodiment, after the entire page i has been read from the NAND Flash, a determination is made whether any uncorrectable errors are encountered for page i (block 724). If there are uncorrectable errors for page i, as determined in block 726, then NAND Flash controller 140 is reconfigured with another setting for a slower memory access rate than the setting currently being used (block 728). In another embodiment, after the entire page i has been read, a determination is made whether any corrected or uncorrectable errors are encountered for page i (block 724). If there are errors of any kind for page i, then NAND Flash controller 140 is reconfigured with another setting for a slower memory access rate (block 728).

Another setting may be selected in various manners in block 728. In one embodiment, the setting for the next slower memory access rate is selected. For example, if errors are encountered with setting 1 in Table 2, then setting 2 is selected. In another embodiment, a setting for a memory access rate that is approximately twice as slow as the current setting is selected. For example, if errors are encountered with setting 1, which uses three input clock cycles per memory access, then setting 4 having six input clock cycles per memory access is selected. In yet another embodiment, the setting for the worst-case access rate is selected if errors are encountered. For example, if setting 5 is for the worst-case access rate, then setting 5 may be selected if errors are encountered for page i, regardless of the setting used to read in page i. In yet another embodiment, the setting for the slowest memory access rate is selected if errors are encountered. In any case, after block 728, the process returns to block 722 to read the same page i from the NAND Flash, albeit using the control signals generated in accordance with the newly selected setting.

If no errors are encountered for the page just read, as determined in block 726, then a determination is made whether all pages have been read from the NAND Flash (block 730). If the answer is 'No', then the page index is incremented as i=i+1 (block 732). The process then returns to block 722 to read the next page from the NAND Flash. Otherwise, if all pages have been read from the NAND Flash, then the process terminates. The current setting that results in a successful read of the NAND Flash may be saved (e.g., in registers 312 within control unit 310 in FIG. 3) and used later as the initial setting for the next NAND Flash access.

If process 700 is performed for a power-on boot, then program code may be read from the NAND Flash and loaded into the SDRAM. After the transfer is completed, the program code in the SDRAM may be executed by the processors and/or controllers within digital section 120.

Figure 8:
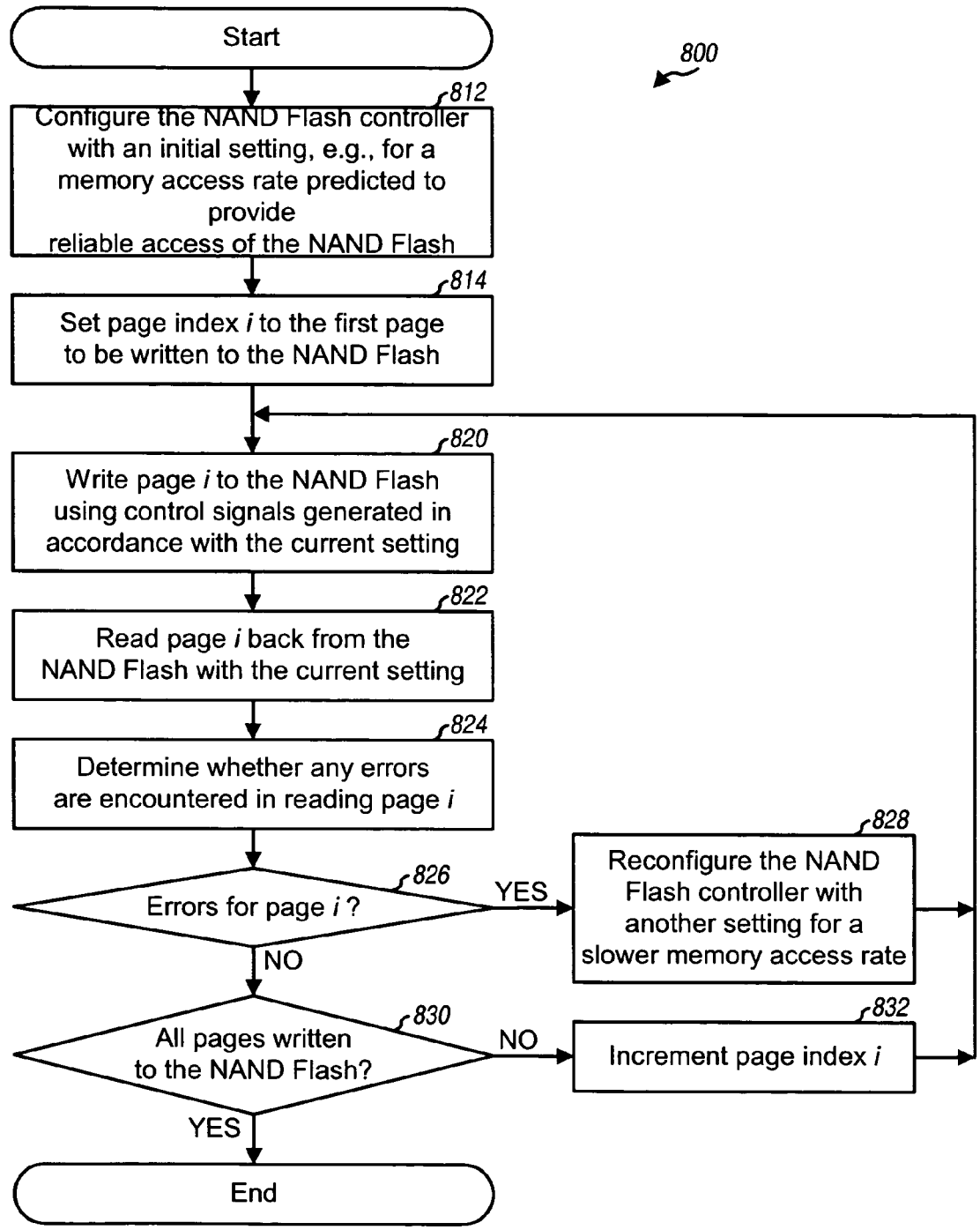
FIG. 8 shows a process for writing data to the NAND Flash with adaptive interface timing.

FIG. 8 shows a flow diagram of a process 800 for writing data to the NAND Flash with adaptive interface timing. Process 800 may be used to write program code or a large amount of data into the NAND Flash. Initially, NAND Flash controller 140 is configured with an initial setting, which may be for the NAND Flash access rate predicted to provide reliable access of the NAND Flash (block 812). This initial setting may be determined as described above for FIG. 7. Control unit 310 generates the RE_n, WE_n, and other control signals for the NAND Flash in accordance with the initial setting.

A page index i is set to the first page to be written to the NAND Flash (block 814). Page i is then written to the NAND Flash using the control signals generated in accordance with the current setting which, for the first page, is the initial setting (block 820). An ECC value is computed for page i and written to the spare area for page i (also in block 820). After the entire page i has been written to the NAND Flash, this same page i is read back from the NAND Flash using the control signals generated in accordance with the current setting (block 822). A determination is then made whether any errors are encountered for page i (block 824). This may be achieved by (1) computing an ECC value for the page read from the NAND Flash and (2) comparing the ECC value computed for the page read from the NAND Flash against the ECC value computed for the page written to the NAND Flash. If there are errors for page i, as determined in block 826, then NAND Flash controller 140 is reconfigured with another setting for a slower memory access rate than the setting currently being used (block 828). This new setting may be selected as described above for FIG. 7. The process then returns to block 820 to write the same page i to the NAND Flash, albeit using the control signals generated in accordance with the newly selected setting.

If no errors are encountered for the page just read, as determined in block 826, then a determination is made whether all pages have been written to the NAND Flash (block 830). If the answer is 'No', then the page index is incremented as i=i+1 (block 832), and the process returns to block 820 to write the next page to the NAND Flash in the same manner. Otherwise, the process terminates if all pages have been written. The current setting that results in a successful write to the NAND Flash may be saved (e.g., in registers 312 within control unit 310 in FIG. 3) and used later as the initial setting for the next NAND Flash access.

The embodiment shown in FIG. 8 writes one page at a time to the NAND Flash and also reads back and verifies each page that is written to the NAND Flash. In another embodiment, the setting that results in a successful write of the first page to the NAND Flash may be deemed to provide reliable access of the NAND Flash. Each remaining page may then be written to the NAND Flash using the setting deemed to be reliable. Alternatively, each remaining page may be written to the NAND Flash using another setting with a slower memory access rate and having more timing margin than the setting used to successfully write the first page.

FIGS. 7 and 8 show exemplary processes for reading data from and writing data to the NAND Flash with adaptive interface timing. The read and write for the NAND Flash with adaptive interface timing may also be performed in other manners, and this is within the scope of the invention.

Memory access with adaptive interface timing, as described herein, may be performed in conjunction with various types of error correction coding and error detection coding. Some exemplary error correction codes include block codes such as Hamming code, Reed-Solomon code, BCH (Bose, Chaudhuri, and Hocquenghem) code, and so on. Systematic block codes can provide ease of use since each block-coded page includes the original unmodified data (which is often called the systematic portion) followed by parity data (which is often called the parity portion). The parity data is the ECC value generated from the data portion. Each systematic block-coded page thus includes P data bytes followed by S parity bytes. The data for the page may be written to or read from the NAND Flash followed immediately by the parity data, and temporary storage is not needed for either the systematic or parity portion. Block coding is described in numerous references available in the art. One such reference is a book by S. Lin and D. Costello, entitled "Error Control Coding: Fundamentals and Applications," Prentice Hall, 1983.

In an embodiment, a Hamming code is used for error correction coding for a NAND Flash having a page size of 512 bytes and a spare area of 16 bytes per page. Each page of 512 data bytes is divided into four independent sets, with each set including 128 data bytes. The Hamming code encodes the 128 data bytes in each set and generates 20 code bits for the set. The total coding overhead for each page is 80 code bits, which may be saved in the 16 spare bytes for the page. This Hamming code has the following error correction/detection capability: (1) can correct one bit error in each set, (2) can detect two or more bit errors in each set, and (3) can correct up to four bit errors distributed over four sets in each page. The above represents a specific error correction coding design. Other designs may also be implemented and are within the scope of the invention.

Error detection codes with no error correction capability may also be used to detect for errors in the NAND Flash data. A common error detection code is a cyclic redundancy check (CRC) code.

Memory access with adaptive interface timing allows for fast and reliable boot. Good performance may be achieved without having to utilize higher speed-grade NAND Flash memory devices. Furthermore, no limitation is placed on the bus between the NAND Flash and the NAND Flash controller. Different external devices may be coupled to this bus for different wireless devices and for different configurations of the same wireless device. The boot process can dynamically and automatically adapt to the different configurations of the wireless device to provide a reliable boot each time the device is powered on.

The memory access techniques described herein may be used for various applications. Such applications include initial power-up booting of executable program code (from the NAND Flash to the SDRAM), downloading and playback of application code (e.g., code for audio, video, and other end applications), run-time loading of executable code (from the NAND Flash to the SDRAM), and so on.

For clarity, the description above is for a specific memory architecture in which the NAND Flash and the SDRAM are both external to digital section 120. In general, the memory access techniques described herein may be used for various types of memory, as long as the data stored in the memory is protected with an error detection/correction code that can flag errors occurring during data transfers to/from the memory. Digital section 120 may be implemented with an ASIC, and the NAND Flash and SDRAM may be implemented on the same or separate integrated circuits that are external to the ASIC. The techniques described herein may also be used in designs whereby the NAND Flash, the SDRAM, or both, are implemented in digital section 120.

Also for clarity, various aspects and embodiments have been described specifically for NAND Flash and SDRAM. Other types of memory may be used for the NAND Flash and the SDRAM. The memory access techniques may be used for other types of memory device besides NAND Flash. These techniques may also be used for data transfer between the NAND Flash and other types of memory such as, for example, an asynchronous SRAM, an asynchronous page read SRAM, a pseudo-SRAM, a DRAM, a pseudo-RAM (non-page and paged), a burst-RAM, and so on.

The memory access techniques described herein may be used for wireless communication devices, consumer electronics devices (e.g., digital cameras, digital audio players, memory card readers/writers, and so on), computer systems, other portable devices, and various other electronics devices and systems. These techniques may be advantageously used for any device in which NAND Flash is used as the mass storage unit, e.g., in a manner similar to a hard disk, so that large amounts of data may be written to and/or read from the NAND Flash. These techniques may also be used for various forms of NAND Flash, such as compact Flash memory cards, secured data (SD) memory cards, and so on.

The memory access techniques described herein may be implemented by various means. The units used to support memory access (e.g., NAND Flash controller 140) may be implemented within an ASIC, a DSP, a digital signal processing device (DSPD), a programmable logic device (PLD), a field programmable gate array (FPGA), a processor, a controller, a micro-controller, a microprocessor, other electronic unit designed to perform the functions described herein, or a combination thereof.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of reading data from a memory device, comprising:
   selecting a first memory access rate for accessing the memory device;
   reading a first page of data from the memory device at the first memory access rate;
   determining whether the first page of data read from the memory device includes errors; and
   selecting a second memory access rate for accessing the memory device if the first page of data read from the memory device includes errors, the second memory access rate being slower than the first memory access rate.

2. The method of claim 1, wherein the memory device is a NAND Flash memory.

3. A method of reading data from a NAND Flash memory, comprising:
   selecting a first memory access rate for accessing the NAND Flash memory;
   reading a first page of data from the NAND Flash memory at the first memory access rate;
   determining whether the first page of data read from the NAND Flash memory includes errors; and
   selecting a second memory access rate for accessing the NAND Flash memory if the first page of data read from the NAND Flash memory includes errors, the second memory access rate being slower than the first memory access rate.

4. The method of claim 3, further comprising:
   if the first page of data read from the NAND Flash memory includes errors, reading the first page of data from the NAND Flash memory again at the second memory access rate.

5. The method of claim 3, further comprising:
   if the first page of data read from the NAND Flash memory includes no errors, reading each of at least one additional page of data from the NAND Flash memory at the first memory access rate.

6. The method of claim 3, further comprising:
   generating control signals for reading data from the NAND Flash memory in accordance with a currently selected memory access rate.

7. The method of claim 3, wherein the first and second memory access rates are associated with first and second numbers of clock cycles, respectively, for each NAND Flash memory access.

8. The method of claim 3, wherein the determining whether the first page of data read from the NAND Flash memory includes errors comprises
determining whether the first page of data read from the NAND Flash memory includes errors based on error correction coding (ECC) used for data stored in the NAND Flash memory.

9. The method of claim 3, wherein the determining whether the first page of data read from the NAND Flash memory includes errors comprises
computing an error correction coding (ECC) value for the first page of data read from the NAND Flash memory,
comparing the computed ECC value against an ECC value read from the NAND Flash memory for the first page, and
determining whether the first page includes errors based on the computed ECC value and the read ECC value for the first page.

10. The method of claim 3, wherein the determining whether the first page of data read from the NAND Flash memory includes errors comprises
determining whether the first page of data read from the NAND Flash memory includes errors based on error detection coding used for data stored in the NAND Flash memory.

11. The method of claim 3, wherein the first memory access rate is a fastest memory access rate among a plurality of supported memory access rates.

12. The method of claim 3, wherein the first memory access rate is a memory access rate used previously to successfully read data from the NAND Flash memory.

13. The method of claim 3, wherein the first memory access rate is a memory access rate predicted to provide reliable access of the NAND Flash memory for majority of operating conditions.

14. The method of claim 3, wherein the second memory access rate is a next slower memory access rate than the first memory access rate among a plurality of supported memory access rates.

15. The method of claim 3, wherein the second memory access rate is a predetermined percentage slower than the first memory access rate.

16. The method of claim 3, wherein the second memory access rate is a memory access rate predicted to provide reliable access of the NAND Flash memory for worst-case operating condition.

17. The method of claim 3, wherein the data read from the NAND Flash memory is for program code.

18. A memory controller comprising:
a control unit operable to obtain a first memory access rate for accessing a NAND Flash memory and to direct reading of a first page of data from the NAND Flash memory at the first memory access rate; and
a detection unit operable to determine whether the first page of data read from the NAND Flash memory includes errors, and
wherein the control unit is operable to obtain a second memory access rate for accessing the NAND Flash memory if the first page of data read from the NAND Flash memory includes errors, the second memory access rate being slower than the first memory access rate.

19. The memory controller of claim 18, wherein the control unit is further operable to generate control signals for reading data from the NAND Flash memory in accordance with a currently selected memory access rate.

20. The memory controller of claim 18, wherein the first and second memory access rates are associated with first and second numbers of clock cycles, respectively, for each NAND Flash memory access.

21. An apparatus for reading data from a NAND Flash memory, comprising:
means for selecting a first memory access rate for accessing the NAND Flash memory;
means for reading a first page of data from the NAND Flash memory at the first memory access rate;
means for determining whether the first page of data read from the NAND Flash memory includes errors; and
means for selecting a second memory access rate for accessing the NAND Flash memory if the first page of data read from the NAND Flash memory includes errors, the second memory access rate being slower than the first memory access rate.

22. The apparatus of claim 21, further comprising:
means for generating control signals for reading data from the NAND Flash memory in accordance with a currently selected memory access rate.

23. An integrated circuit comprising:
a control unit operable to obtain a first memory access rate for accessing a NAND Flash memory external to the integrated circuit and to direct reading of a first page of data from the NAND Flash memory at the first memory access rate; and
a detection unit operable to determine whether the first page of data read from the NAND Flash memory includes errors, and
wherein the control unit is operable to obtain a second memory access rate for accessing the NAND Flash memory if the first page of data read from the NAND Flash memory includes errors, the second memory access rate being slower than the first memory access rate.

24. A wireless device comprising:
a control unit operable to obtain a first memory access rate for accessing a NAND Flash memory and to direct reading of a first page of data from the NAND Flash memory at the first memory access rate; and
a detection unit operable to determine whether the first page of data read from the NAND Flash memory includes errors, and
wherein the control unit is operable to obtain a second memory access rate for accessing the NAND Flash memory if the first page of data read from the NAND Flash memory includes errors, the second memory access rate being slower than the first memory access rate.

25. The wireless device of claim 24, wherein the data read from the NAND Flash memory is program code for the wireless device.

26. The wireless device of claim 25, wherein the control unit is operable to read the program code from the NAND Flash memory each time the wireless device is powered on.

27. A method of writing data to a NAND Flash memory, comprising:
selecting a first memory access rate for accessing the NAND Flash memory;
writing a first page of data to the NAND Flash memory at the first memory access rate;

determining whether the first page of data was written correctly to the NAND Flash memory; and selecting a second memory access rate for accessing the NAND Flash memory if the first page of data was not correctly written to the NAND Flash memory, the second memory access rate being slower than the first memory access rate.

28. The method of claim 27, wherein the determining whether the first page of data was written correctly to the NAND Flash memory includes reading the first page of data back from the NAND Flash memory at the first memory access rate, determining whether the first page of data read from the NAND Flash memory includes errors, and declaring the first page of data to be correctly written to the NAND Flash memory if the first page of data read back from the NAND Flash memory includes no errors.

29. The method of claim 27, wherein the first and second memory access rates are associated with first and second numbers of clock cycles, respectively, for each NAND Flash memory access.

30. A memory controller comprising:

a control unit operable to obtain a first memory access rate for accessing a NAND Flash memory and to direct writing of a first page of data to the NAND Flash memory at the first memory access rate;

a detection unit operable to determine whether the first page of data was written correctly to the NAND Flash memory, and wherein the control unit is further operable to obtain a second memory access rate for accessing the NAND Flash memory if the first page of data was not correctly written to the NAND Flash memory, the second memory access rate being slower than the first memory access rate.

31. The memory controller of claim 30, wherein the detection unit is operable to receive the first page of data read back from the NAND Flash memory at the first memory access rate, determine whether the first page of data read back from the NAND Flash memory includes errors, and declare the first page of data to be correctly written to the NAND Flash memory if the first page of data read back from the NAND Flash memory includes no errors.

32. An apparatus for writing data to a NAND Flash memory, comprising:

means for selecting a first memory access rate for accessing the NAND Flash memory;

means for writing a first page of data to the NAND Flash memory at the first memory access rate;

means for determining whether the first page of data was written correctly to the NAND Flash memory; and means for selecting a second memory access rate for accessing the NAND Flash memory if the first page of data was not correctly written to the NAND Flash memory, the second memory access rate being slower than the first memory access rate.

33. The apparatus of claim 32, wherein the means for determining whether the first page of data was written correctly to the NAND Flash memory includes means for reading the first page of data back from the NAND Flash memory at the first memory access rate, means for determining whether the first page of data read back from the NAND Flash memory includes errors, and means for declaring the first page of data to be correctly written to the NAND Flash memory if the first page of data read back from the NAND Flash memory includes no errors.

* * * * *